(12) United States Patent
Okada (10) Patent No.: US 7,075,128 B2
(45) Date of Patent: Jul. 11, 2006

(54) CHARGE TRANSFER ELEMENT HAVING HIGH OUTPUT SENSITIVITY

(75) Inventor: Yoshihiro Okada, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 162 days.

(21) Appl. No.: 10/773,112

(22) Filed: Feb. 5, 2004

(65) Prior Publication Data

US 2004/0183105 A1    Sep. 23, 2004

(30) Foreign Application Priority Data

Feb. 6, 2003    (JP)    ............... 2003-029724

(51) Int. Cl.
*H01L 27/148* (2006.01)
*H01L 29/74* (2006.01)

(52) U.S. Cl. ............ 257/219; 257/218; 257/220; 257/221; 257/222; 438/48; 438/78; 438/79

(58) Field of Classification Search ........ 257/218–225, 257/229–230, 241, 248; 438/48, 78–79, 438/75, 144; 348/241, 248, 311, 294

See application file for complete search history.

(56) References Cited

FOREIGN PATENT DOCUMENTS

| EP | 0499275 | * | 8/1992 |
|---|---|---|---|
| JP | 2000-091557 | | 3/2000 |

* cited by examiner

*Primary Examiner*—Donghee Kang
(74) *Attorney, Agent, or Firm*—Hogan & Hartson LLP (57) ABSTRACT

A charge transfer element comprising a reverse conductive type well formed on the surface of one conductive type semiconductor substrate, the one conductive type channel region extending in one direction relative to the well, a transfer electrode formed intersecting the channel region, a floating diffusion region formed continuous from the channel region, and an output transistor having a gate connected to the floating diffusion region. In a region where the output transistor is formed, the dopant density profile in the depth direction of the semiconductor substrate exhibits the maximum value relative to a middle region.

4 Claims, 7 Drawing Sheets

CHARGE TRANSFER ELEMENT HAVING HIGH OUTPUT SENSITIVITY

BACKGROUND OF THE INVENTION

1. Field of the Invention

The present invention relates to a charge transfer element and in particular to a structure of an output section which enhances output sensitivity.

2. Description of the Related Art

Figure 7:
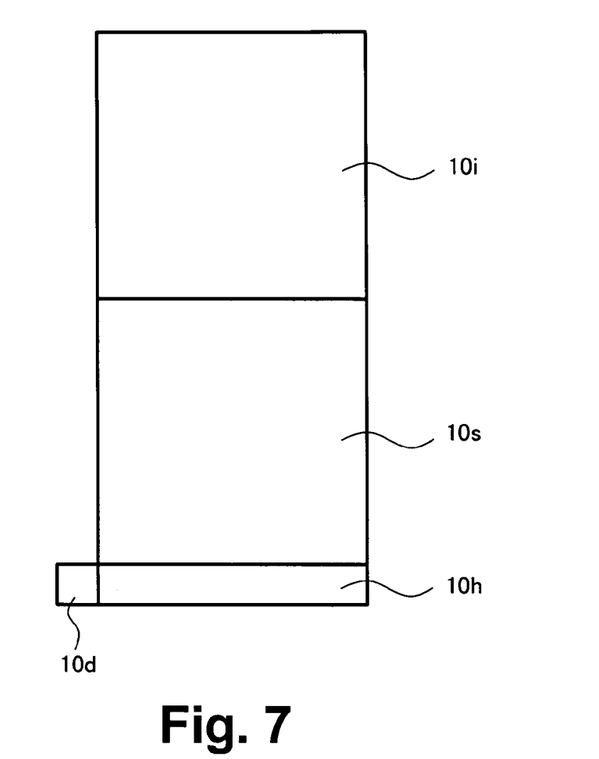
FIG. 7 is a block diagram schematically showing a structure of a solid state image capturing element.

FIG. 7 shows a structure of a CCD solid state image capturing element of a frame transfer type. A CCD solid state image capturing element of a frame transfer type comprises an image capturing section $10i$, a storage section $10s$, a horizontal transfer section $10h$, and an output section $10d$. The image capturing section $10i$ generates information charge and transfers to the subsequent storage section $10s$ to store therein using a charge transfer element which is a CCD shift register. Besides being stored in the storage section $10s$, the information charge is also transferred to the subsequent horizontal transfer section $10h$ in units of one line and further to the output section $10d$ in units of one pixel. The output section $10d$ converts the information charge of an amount for each pixel into a voltage value, and variation of the voltage values is output as a CCD output.

A floating diffusion (capacitive) region having a capacitance for temporary storage of information charge is provided on the output side of the channel region of the horizontal transfer section $10h$, and potential variation caused by the charge stored in the capacity is extracted as an output signal. The potential value of an output signal is determined by dividing the amount of the stored information charge by the capacitance value of the floating diffusion region. Reduction of the capacitance value of the floating diffusion region enables enhancement of the output sensitivity of the solid state image capturing element.

Figure 8:
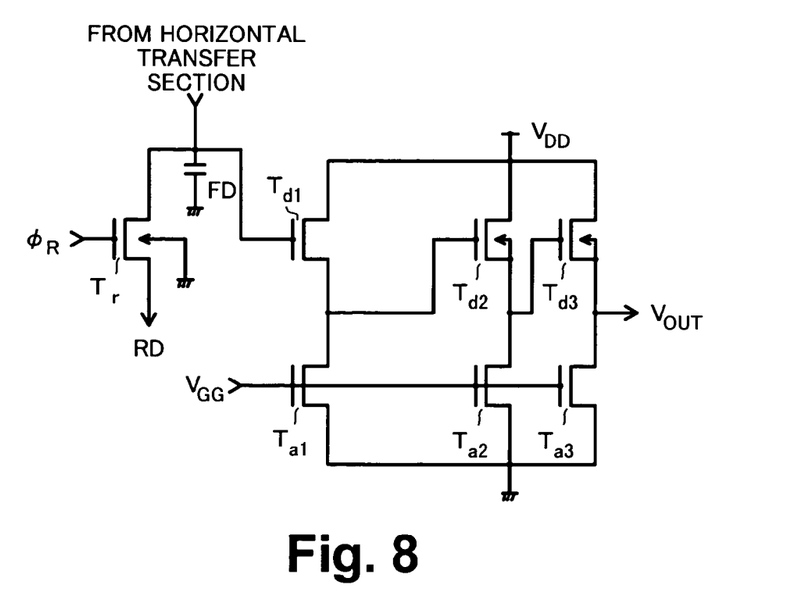
FIG. 8 is a diagram showing an equivalent circuit of an output section of a solid state image capturing element according to background art.
Figure 9:
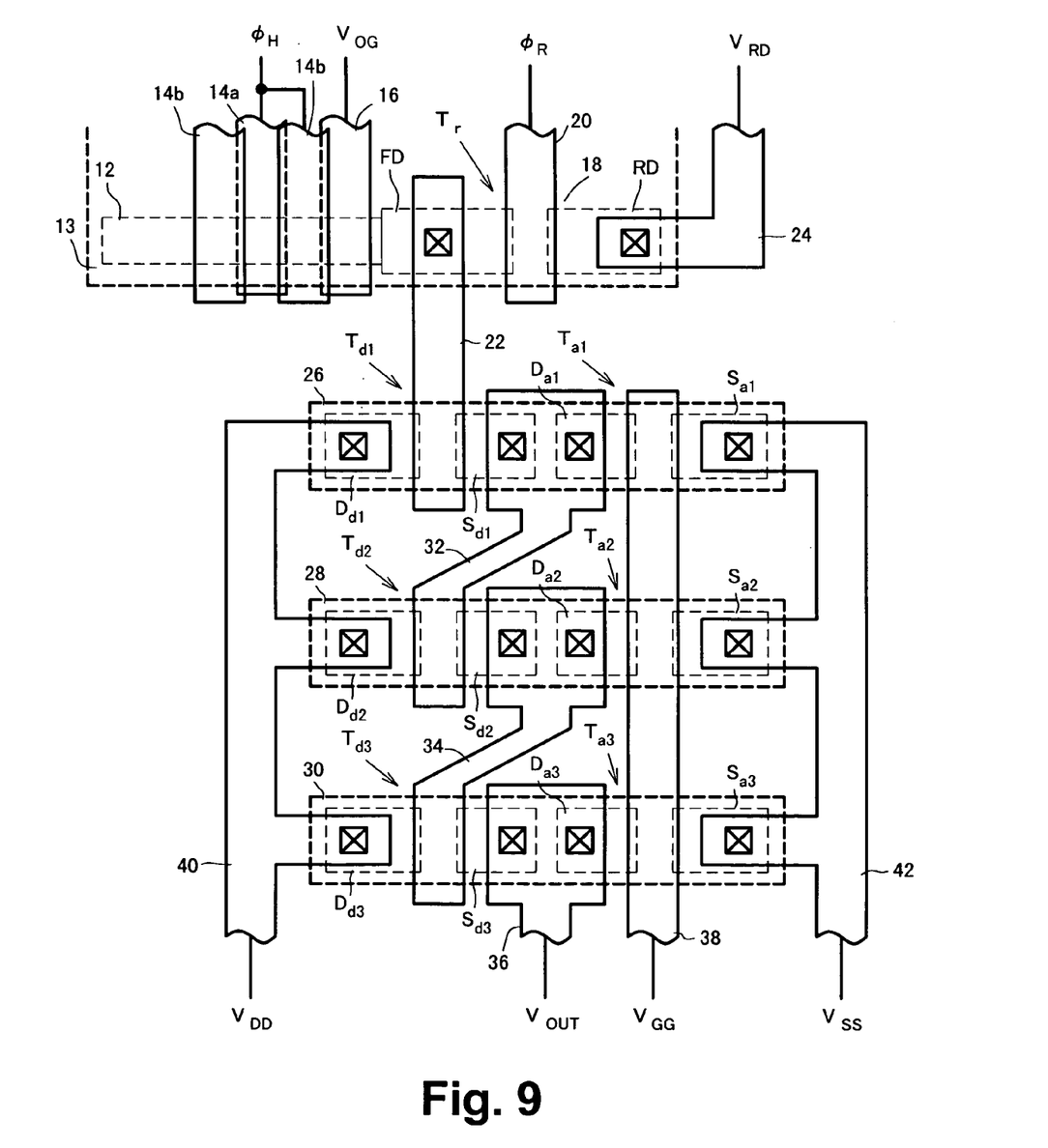
FIG. 9 is a plan view showing a structure of an output section of a solid state image capturing element according to background art.

FIG. 8 is a diagram showing an equivalent circuit of the output section $10d$, and FIG. 9 is a plan view showing a structure of the horizontal transfer section $10h$ and the output section $10d$.

As shown in FIG. 8, the output section $10d$ basically comprises three output transistors $T_{d1}$, $T_{d2}$, $T_{d3}$ and three load transistors $T_{a1}$, $T_{a2}$, $T_{a3}$. The output transistor $T_{d1}$ and the load transistor $T_{a1}$ are serially connected and together constitute a first-stage source follower circuit. Likewise, the output transistor $T_{d2}$ and the load transistor $T_{a2}$, and the output transistor $T_{d3}$ and the load transistor $T_{a3}$ are respectively, serially connected to constitute second and third-stage source follower circuits.

The gate of the output transistor $T_{d1}$ of the first-stage source follower circuit is connected to a floating diffusion region FD. The first to third-stage source follower circuits are serially connected, so that the source potential of the output transistor $T_{d3}$ of the third-stage source follower circuit is extracted as an output signal $V_{OUT}$ of the solid state image capturing element.

A channel region 12 of the horizontal transfer section $10h$ is formed in a P-well 13 which is formed in one major surface of the horizontal transfer section $10h$ by diffusing P-type dopants in an N-type semiconductor substrate. Here, the P-well 13 receives a ground potential $V_{GND}$, while the N-type semiconductor substrate receives a potential of about 5 to 10 V.

An element region 18 on the channel region 12, where a reset transistor $T_r$ is to be formed, is formed continuous from the channel region 12. Regions for a drain and a source of the reset transistor $T_r$ contain N-type dopants diffused therein, respectively forming a floating diffusion region FD and a reset drain region RD.

On the channel region 12, via an insulating film, a plurality of transfer electrodes 14$a$, 14$b$ are arranged in parallel to one another. An output control electrode 16 is also arranged in parallel to the transfer electrodes 14$a$, 14$b$. The transfer electrodes 14$a$, 14$b$ receive a transfer clock $\phi_H$, in synchronism with which information charge is transferred along the channel region 12 to the output control electrode 16. The output control electrode 16 receives a constant output control voltage $V_{OG}$, at which time the information charge is output through a channel formed beneath the output control electrode 16 to the floating diffusion region FD.

In the element region 18, a reset electrode 20 is formed via an insulating film so as to bridge the floating diffusion region FD and the reset drain region RD, whereby the reset transistor $T_r$ is completed. The floating diffusion region FD is connected to a source wire 22, while the reset drain region RD is connected to a drain wire 24.

The information charge having been output to the floating diffusion region FD upon application of the output control voltage $V_{OG}$ is stored therein, and converted into a voltage value. The voltage value of the floating diffusion region FD is extracted through the source wire 22.

A drain voltage $V_{RD}$ is applied to the drain wire 24 and a reset clock $\phi_R$ is applied to the reset electrode 20 to thereby turn on the reset transistor $T_r$. Thereupon, the information charge stored in the floating diffusion region FD is output via the reset drain region RD into the drain wire 24.

An element region 26 where the first-stage source follower circuit is to be formed is formed on the semiconductor substrate, separated from the element region 18 by a predetermined distance. Further, an element region 28 where the second-stage source follower circuit is to be formed and an element region 30 where the third-stage source follower circuit is to be formed are similarly formed, separated from the other regions by a predetermined distance.

The element regions 26, 28, 30 are formed in P-wells which are formed by diffusing P-type dopants in one major surface of an N-type semiconductor substrate. N-type dopants are doped into the element region 26 so that a drain region $D_{d1}$ and a source region $S_{d1}$ of an output transistor $T_{d1}$ and a drain region $D_{a1}$ and a source region $S_{a1}$ of a load transistor $T_{a1}$ are formed. Likewise, N-type dopants are doped into the element regions 28, 30 to form drain regions $D_{d2}$, $D_{a2}$, $D_3$, $D_{a3}$ and source regions $S_{d2}$, $S_{a2}$, $S_{d3}$, $S_{a3}$.

The source wire 22 extends to the element region 26 and arranged, via an insulating film, so as to bridge the drain region $D_{d1}$ and the source region $S_{d1}$, while constituting a gate electrode of the output transistor $T_{d1}$. The source region $S_{d1}$ of the output transistor $T_{d1}$ and the drain region $D_{a1}$ of the load transistor $T_{a1}$ are connected to each other via a source wire 32. The source wire 32 extends to the element region 28 and is arranged, via an insulating film, so as to bridge the drain region $D_{d2}$ and the source region $S_{d2}$, while constituting a gate electrode of the output transistor $T_{d2}$. Likewise, a source region $S_{d2}$, a drain region $D_{a2}$, and a gate electrode of the output transistor $T_{d3}$ are connected to one another via a source wire 34 of the output transistor $T_{d2}$. A source region $S_{d3}$ and a drain region $D_{a3}$ are connected to each other via a source wire 36. The source wire 36 serves as an extraction wire through which an output signal $V_{OUT}$ is extracted from the solid state image capturing element.

A gate electrode 38 is arranged via an insulating film on the drain regions $D_{a1}$, $D_{a2}$, $D_{a3}$ and the source regions $S_{a1}$, $S_{a2}$, $S_{a3}$ of the load transistors $T_{a1}$, $T_{a2}$, $T_{a3}$, and the gate electrode 38 receives a common gate potential $V_{GG}$. Further, the drain regions $D_{d1}$, $D_{d2}$, $D_{d3}$ are connected to one another via a drain wire 40 and receive a common power source potential $V_{DD}$, while the source regions $S_{a1}$, $S_{a2}$, $S_{a3}$ are connected to one another via a ground wire 42 and maintained at a ground potential $V_{GND}$.

SUMMARY OF THE INVENTION

In a charge transfer element having a structure comprising the above-described horizontal transfer section 10h and output section 10d, when the P-well of the element region 26 of the first-stage output transistor $T_{d1}$ is fixed at the ground potential $V_{GND}$, a backgate effect is caused in which a threshold voltage $V_{th}$ of the output transistor $T_{d1}$ is caused to vary, as shown in Expression (1), along with the variation in the potential $V_{BS}$ of the source wire 32. The backgate effect in turn causes the gain of the output transistor $T_{d1}$ to vary and, resultantly, leads to a problem including, for example, unstable output from the solid state image capturing element.

$$V_{th} \propto \sqrt{N_a \cdot V_{BS}} \qquad (1)$$

$N_a$: surface density of P-well
$V_{BS}$: source potential

The backgate effect may be suppressed using a method in which the P-well and the source region $S_{d1}$ of the element region 26 of the output transistor $T_{d1}$ are connected to each other to be fixed at the same potential. This method, however, causes a potential difference between the P-well 13 and the P-well of the element region 26, increasing the likelihood of shorting between the P-well 13 and the P-well of the element region 26. In order to address this problem, these regions must be positioned apart from each other by an extent which can prevent the shorting. This results in enlargement of the size of the solid state image capturing element.

In addition, the larger separation of these regions in order to prevent mutual shorting would result in a longer source wire 22 connecting the floating diffusion region FD and the gate of the output transistor $T_{d1}$, and thus increase the wire capacitance of the source wire 22. Then, the wire capacitance of the source wire 22 and the capacitance of the floating diffusion region FD are caused to be combined and, as a result, potential variation caused when storing some information charge becomes smaller compared to other cases. This leads to a problem such as reduction of the gain of the output section 10d and/or the operation speed of the solid state image capturing element.

The present invention has been conceived in view of the above described problems relating to the background art, and advantageously provides a charge transfer element having an output section having an improved structure in order to solve at least one of the above-described problems.

According to the present invention, there is provided a charge transfer element, comprising a reverse conductive type semiconductor region formed in one major surface of one conductive type semiconductor substrate; a channel region of the one conductive type formed in the semiconductor region so as to extend in one direction; a plurality of transfer electrodes formed on the semiconductor substrate so as to intersect the channel region; a capacitance formed continuous from the channel region in the semiconductor region; and an output transistor having a source and a drain both formed in the semiconductor region, and a gate connected to the capacitance, wherein the semiconductor region where the output transistor is formed exhibits an dopant density profile in a depth direction of the semiconductor substrate, which has a maximum dopant density value relative to a middle region of the semiconductor region.

DESCRIPTION OF THE PREFERRED EMBODIMENTS

A charge transfer element in this embodiment is incorporated into a solid state image capturing element. A solid state image capturing element will be described below in detail with reference to the attached drawings.

<Structure of Solid State Image Capturing Element>

A solid state image capturing element in this embodiment has a structure identical to that of the CCD solid state image capturing element of a frame transfer type shown in FIG. 7.

Figure 2:
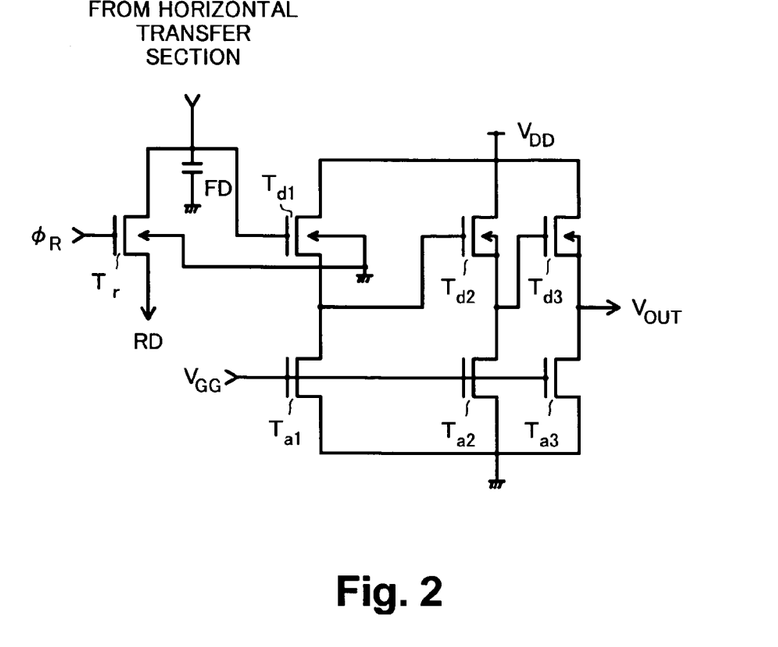
FIG. 2 is a plan view showing a structure of an output section of a solid state image capturing element in the embodiment of the present invention.

FIG. 2 shows an equivalent circuit of an output section 10d of a solid state image capturing element in this embodiment. Similar to the background art, the output section 10d comprises serially connected three-stage source follower circuits which basically include three output transistors $T_{d1}$, $T_{d2}$, $T_{d3}$ and three load transistors $T_{a1}$, $T_{a2}$, $T_{a3}$.

Figure 1:
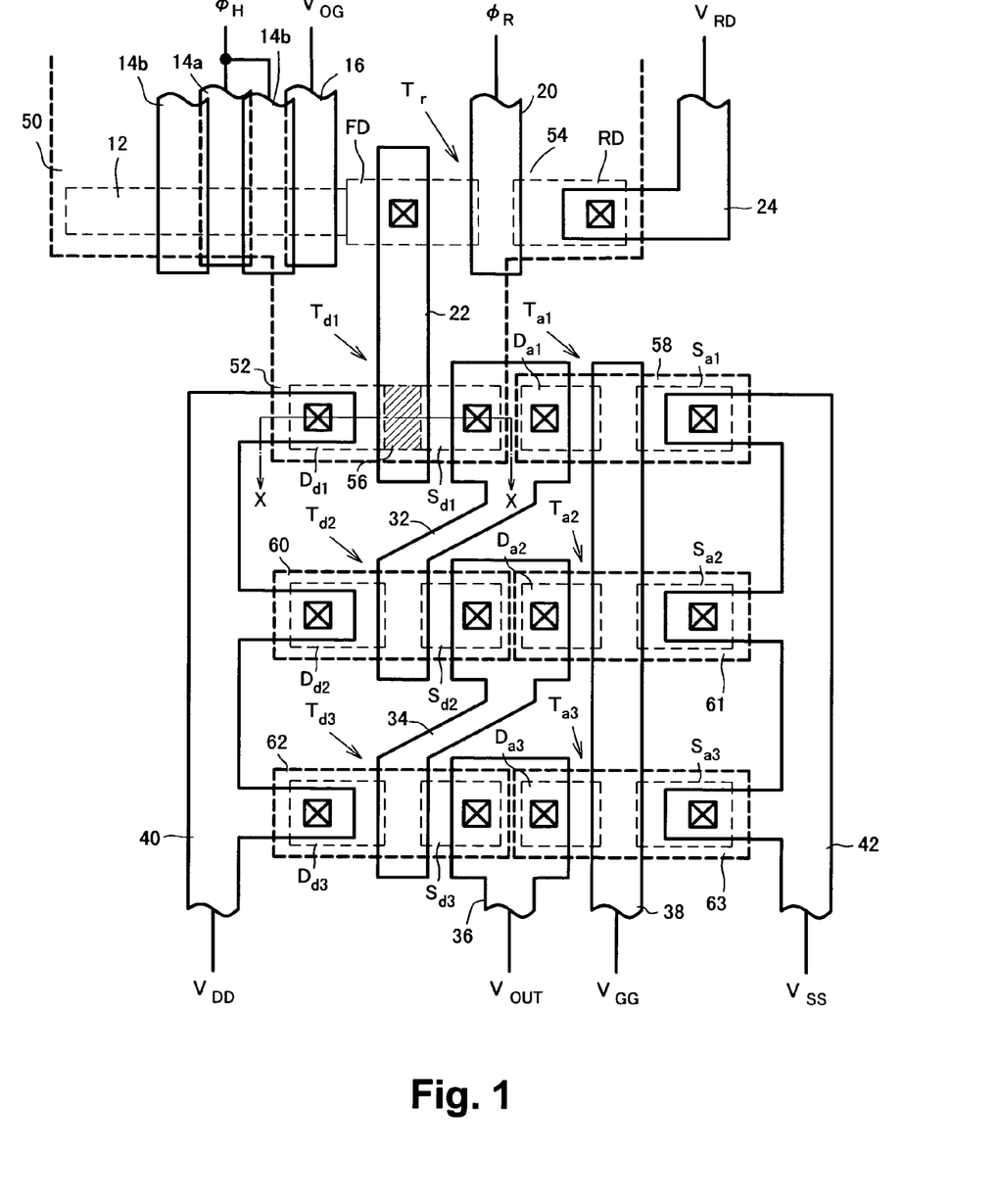
FIG. 1 is a diagram showing an equivalent circuit of an output section of a solid state image capturing element in an embodiment of the present invention.

FIG. 1 is a plan view showing a structure of the output section 10d. A channel region 12 of a horizontal transfer section 10h is formed in a P-well 50 which is formed by diffusing P-type dopants in one major surface of an N-type semiconductor substrate. The P-well 50 is formed continuous from the P-well where the image capturing section 10i and the storage section 10s are formed, and receives a ground potential $V_{GND}$. In this embodiment, the P-well 50 is formed extending to an element region 52 of the output transistor $T_{d1}$.

Element region 54, which is formed continuous from the horizontal transfer section 10h, has N-type dopants diffused regions therein, respectively forming a floating diffusion region FD and a reset drain region RD of a reset transistor $T_r$.

On the channel region 12, via an insulating film, transfer electrodes 14a, 14b and an output control electrode 16 are arranged in parallel. A reset electrode 20 of the reset transistor $T_r$ is arranged via an insulating film so as to bridge the floating diffusion region FD and the reset drain region RD. The floating diffusion region FD is connected to a source wire 22, while the reset drain region RD is connected to a drain wire 24.

An element region 52 which continues from the P-well 50 has N-type dopants diffused therein to form a drain region $D_{d1}$ and a source region $S_{d1}$ of the output transistor $T_{d1}$. A channel dope region 56 where low density N-type dopants are doped is formed in a region near the surface of the P-well between the drain region $D_{d1}$ and the source region $S_{d1}$.

The source wire 22 of the reset transistor Tr extends to the element region 52 and is arranged via an insulating film so as to bridge a drain region $D_{d1}$ and a source region $S_{d1}$, while constituting a gate electrode of the output transistor $T_{d1}$.

On the semiconductor substrate, there are formed an element region 58 where a first-stage load transistor $T_{a1}$ is to be formed, an element region 60 where a second-stage source follower circuit is to be formed, and an element region 62 where a third-stage source follower circuit is to be formed, respectively positioned separated from one another by a predetermined distance. The element regions 58, 61, 63 are formed in P-wells which are formed by diffusing P-type dopants in one major surface of the N-type semiconductor substrate, and the respective P-wells receive a ground potential $V_{GND}$. N-type dopants are diffused in the element regions 58, 61, 63, where drain regions $D_{a1}$, $D_{a2}$, $D_{a3}$ and source regions $S_{a1}$, $S_{a2}$, $S_{a3}$ of the load transistors $T_{a1}$, $T_{a2}$, $T_{a3}$ are formed. Element regions 60, 62 are arranged adjacent to the respective element regions 61, 63, and doped with P-type and N-type dopants at respective portions, forming P-wells where drain regions $D_{d2}$, $D_{d3}$, and source regions $S_{d2}$, $S_{d3}$ of the output transistors $T_{d2}$, $T_{d3}$ are to be formed. In the element regions 60, 62, $P^+$ regions are formed in the P-wells and connected to the source regions $S_{d2}$, $S_{d3}$ thereby fixing the potential of the P-wells at the source potential.

Wires which respectively connect the output transistors $T_{d1}$, $T_{d2}$, $T_{d3}$ and the load transistors $T_{a1}$, $T_{a2}$, $T_{a3}$ are arranged similar to a conventional arrangement. That is, the source region $S_{d1}$ of the output transistor $T_{d1}$ and the drain region $D_{a1}$ of the load transistor $T_{a1}$ are connected to each other via a source wire 32, which extends to the element region 60 and is arranged via an insulating film so as to bridge the drain region $D_{d2}$ and the source region $S_{d2}$. Likewise, the source region $S_{d2}$ and the drain region $D_{a2}$ are connected to each other via a source wire 34, which serves as a gate electrode of the output transistor $T_{d3}$. The source region $S_{d3}$ and the drain region $D_{a3}$ are connected to each other via a source wire 36, which serves as an extraction wire through which an output signal $V_{OUT}$ of the solid state image capturing element is extracted. A gate electrode 38 is arranged via an insulating film on the load transistors $T_{a1}$, $T_{a2}$, $T_{a3}$. The drain regions $D_{d1}$, $D_{d2}$, $D_{d3}$ are connected to one another via a drain wire 40, while the source regions $S_{a1}$, $S_{a2}$, $S_{a3}$ are connected to one another via a ground wire 42.

Figure 3:
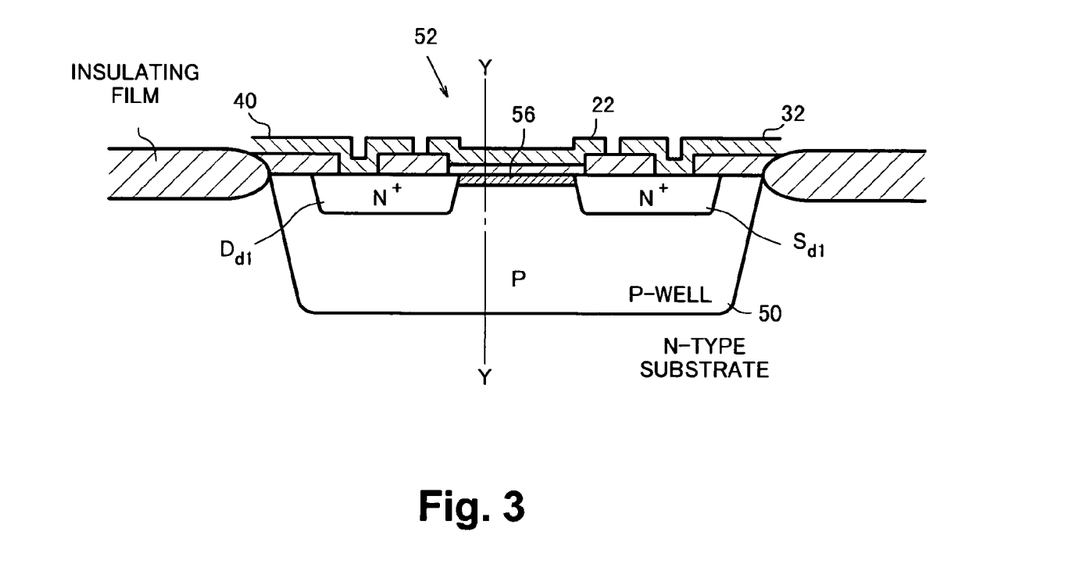
FIG. 3 is a lateral cross section of an output section of a solid state image capturing element in the embodiment of the present invention.
Figure 4:
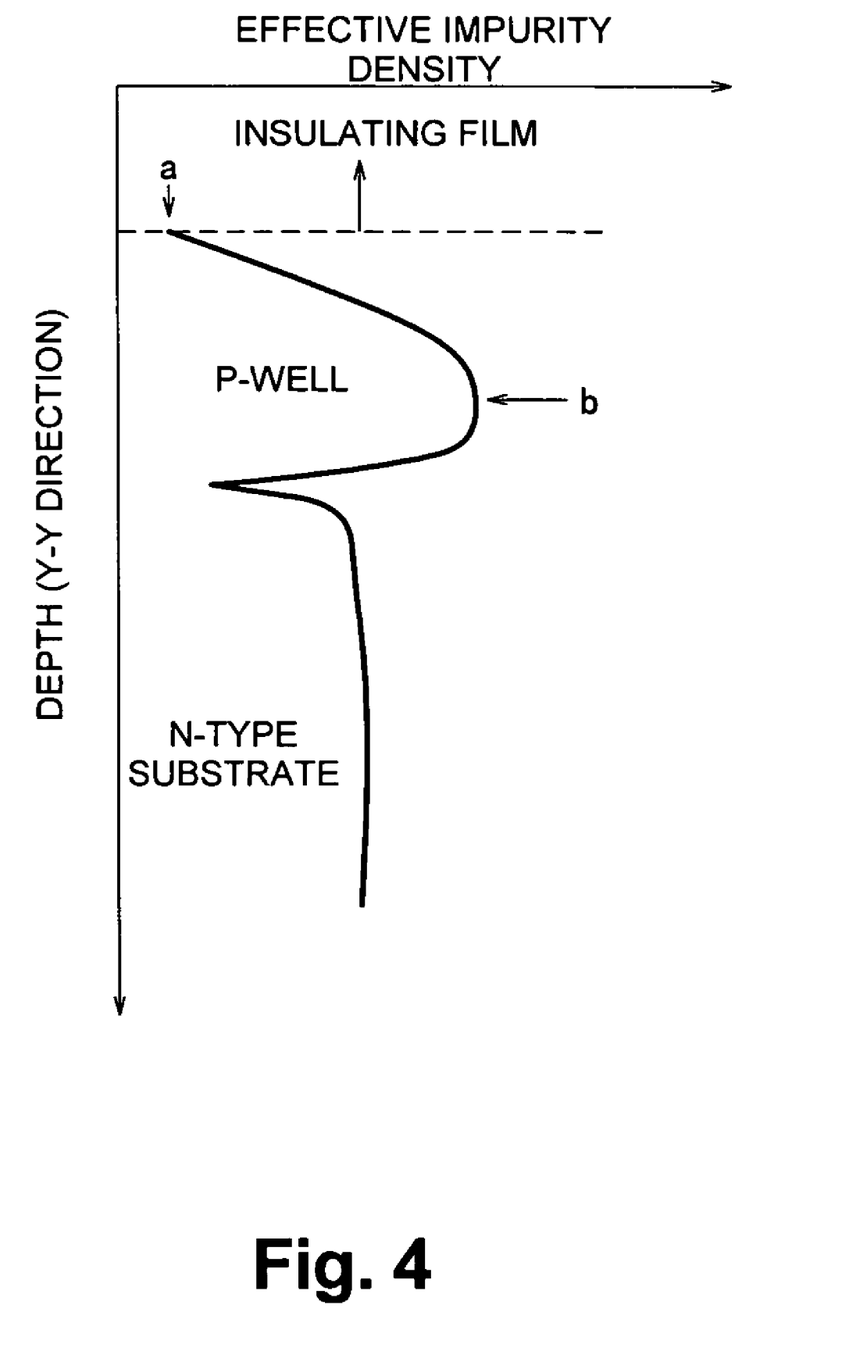
FIG. 4 is a diagram showing an effective dopant density profile of an output transistor of a solid state image capturing element in the embodiment of the present invention.

FIG. 3 is a cross section of the output transistor $T_{d1}$ of the solid state image capturing element in this embodiment, along the segment X—X shown in FIG. 1. FIG. 4 shows an effective dopant density profile in the depth direction along the segment Y—Y in FIG. 3.

The element region 52 where the output transistor $T_{d1}$ is formed is a part of the P-well 50 where the channel region 12 of the horizontal transfer section 10h is also formed, and high density N-type dopants are doped in the P-well 50, forming the drain region $D_{d1}$ and the source region $S_{d1}$. N-type dopants are doped in a region near the surface of the P-well 50, between the drain region $D_{d1}$ and the source region $S_{d1}$, in order to attain counter doping whereby a channel dope region 56 is formed in a gate region of the output transistor $T_{d1}$. Therefore, the dopant density of the P-well 50 where the output transistor $T_{d1}$ is formed is lower in the surface region a rather than in the middle region b. That is, the impurity profile in the substrate depth direction exhibits the maximum value relative to the middle region b in the P-well 50.

Figure 5:
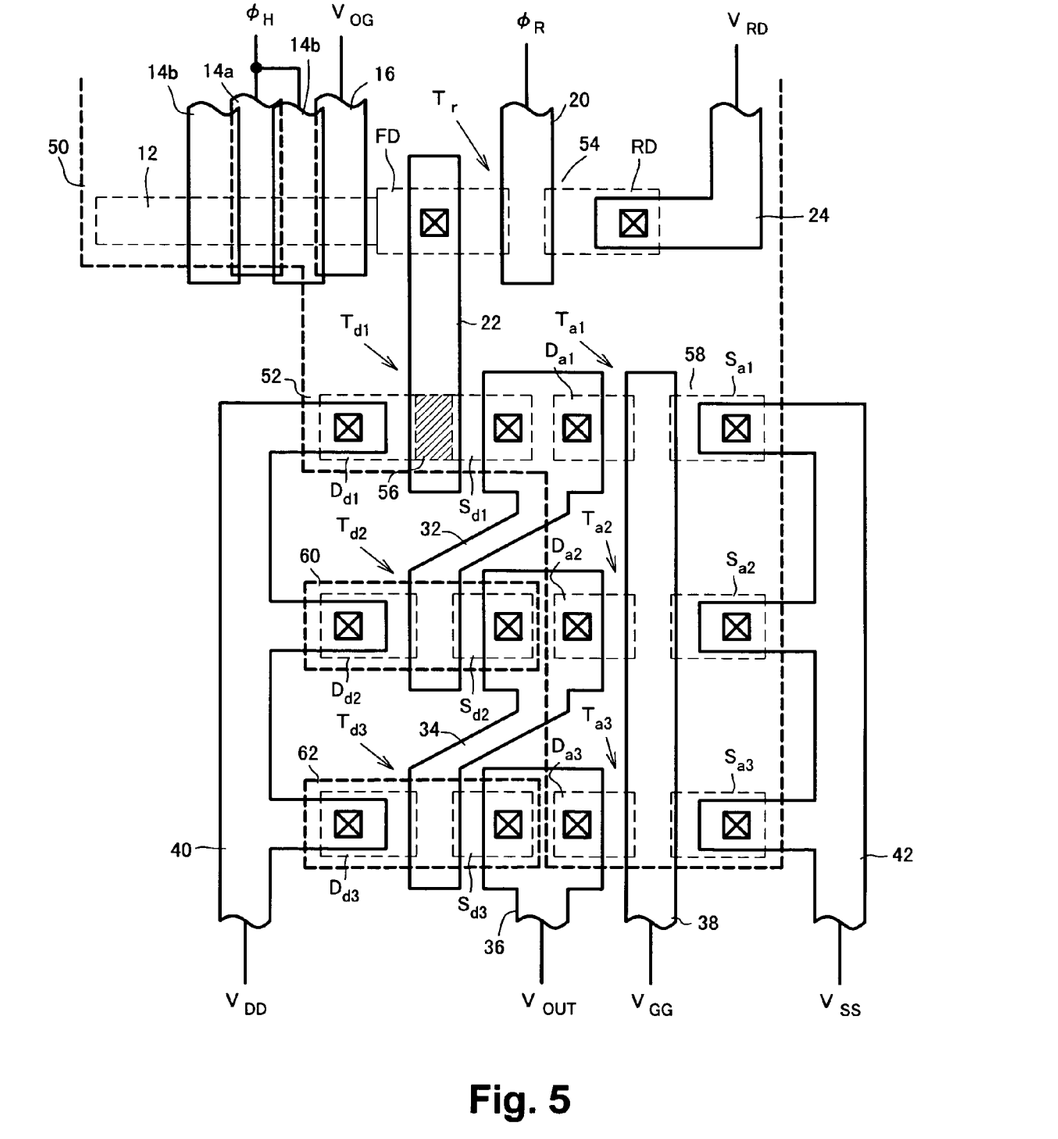
FIG. 5 is a lateral cross section of a modified example of an output section of a solid state image capturing element in this embodiment of the present invention.

Alternatively, the structure of the output section 10d may be formed such that, as shown in FIG. 5, the P-well 50 where the channel region 12 is to be formed is formed extending so as to provide a common P-well where the load transistors $T_{a1}$, $T_{a2}$, $T_{a3}$ are to be formed.

<Method for Forming Solid State Image Capturing Element>

Figure 6:
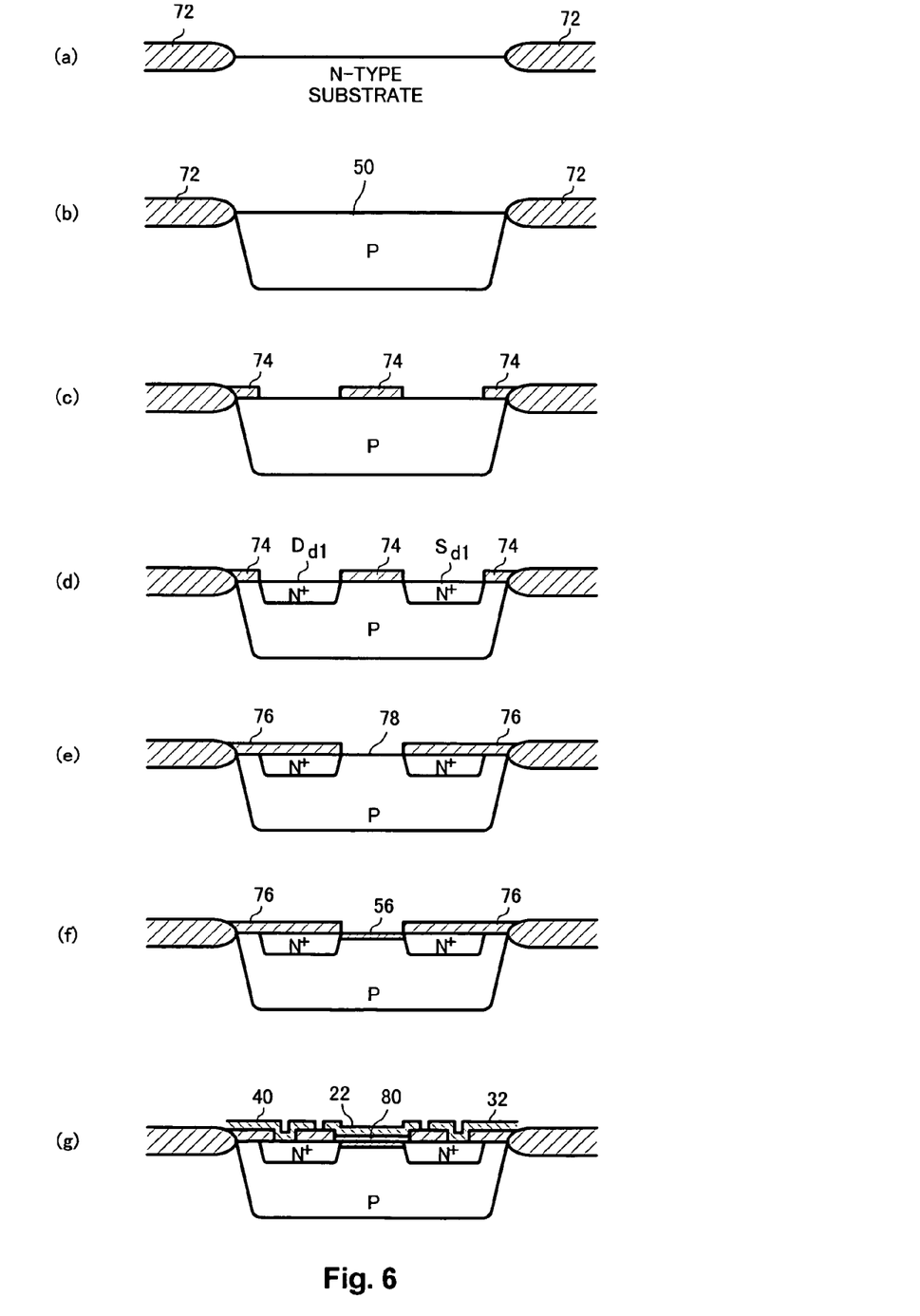
FIG. 6 is a process flow diagram showing respective stages in manufacturing of the solid state image capturing element in the embodiment of the present invention.

FIG. 6 is a process flow diagram showing formation of the output section 10d of a solid state image capturing element in this embodiment. In the following, a method for forming the output section 10d will be described with reference to FIG. 6.

An oxide film 72 is formed on an N-type semiconductor substrate 70 and, subsequently, an opening is formed using a predetermined mask pattern in a region where a P-well 50 is to be formed (FIG. 6(a)). The resultant oxide film 72 is used as a mask in the following ion doping stage and finally as a field oxide film for separation of the element.

Using the oxide film 72 as a mask, P-type impurity ions, such as boron (B), aluminum (Al), gallium (Ga), or indium (In), are doped and then diffused whereby the P-well 50 is formed in the semiconductor substrate 70 (FIG. 6(b)). For example, P-type dopants may be doped at an a real density of $10^{12}$~$10^{13}$/cm$^2$ with energy of a few hundreds of keV.

Further, another oxide film 74 is formed over the opening of the oxide film 72 and openings are newly formed using a predetermined mask pattern in regions where the drain region $D_{d1}$ and the source region $S_{d1}$ of the output transistor $T_{d1}$ are to be respectively formed (FIG. 6(c)). This oxide film 74 is used as a mask in the following ion doping stage.

Using the oxide film 74 as a mask, N-type impurity ions, such as phosphor (P), arsenic (As), or antimony (Sb), are doped and then diffused, whereby a drain region $D_{d2}$ and a source region $S_{d2}$ are formed in the P-well 50 (FIG. 6(d)). For example, N-type dopants may be doped at an a real density of $10^{15}$~$10^{16}$/cm$^2$ with energy of a few tens of keV.

The processing at the respective stages shown in FIGS. 6(a) through (d) can be simultaneously applied to the element region 54 where the reset transistor $T_r$ is to be formed and/or the element regions 58, 60, 62 where other transistors are to be formed. As a result, the P-wells of the element regions 58, 60, 62, the floating diffusion region FD, the reset drain region RD, the drain regions $D_{a1}$, $D_{d2}$, $D_{a2}$, $D_{d3}$, $D_{a3}$, and the source regions $S_{a1}$, $S_{d2}$, $S_{a2}$, $S_{d3}$, $S_{a3}$ can be formed.

Subsequently, after removing the oxide film 74, another oxide film 76 is formed and an opening is newly formed using a predetermined mask pattern in a region where a gate region 78 of the output transistor $T_{d1}$ is to be formed (i.e., a region between the drain region $D_{d1}$ and the source region $S_{d1}$). No opening is formed in a region where gate regions of the reset transistor $T_r$, other output or load transistors, or the like are to be formed. The oxide film 76 is used as a mask in the following ion doping stage.

Using the oxide film 76 as a mask, N-type dopant ions, such as phosphor (P), arsenic (As), or antimony (Sb), are doped and then diffused, whereby a channel dope region 56 is formed (FIG. 6(f)). For example, N-type dopants may be doped at an a real density of $10^{12} \sim 10^{13}/\text{cm}^2$ with energy of a few tens of keV.

Further, an opening is formed in the oxide film 76 in each of the regions where gate regions of transistors other than the output transistor $T_{d1}$ are to be formed, and gate oxide films 80 are formed in the respective gate regions. Then, a poly-silicon layer and a metal layer are formed to provide wiring, using predetermined mask patterns (FIG. 6(g)).

The output section 10d of a solid state image capturing element in this embodiment can be formed as described above. However, it should be noted that the present invention is not limited to the above described example, and that other existing semiconductor forming methods can also be used. It should also be noted that, although the output section 10d alone of a solid state image capturing element is described in this embodiment, the above-described formation processing may also be partly used in formation of other regions of a solid state image capturing element.

As described above, a backgate effect of the output transistor $T_{d1}$ of a solid state image capturing element can be suppressed in this embodiment through reduction of the effective P-type dopant density relative to the surface region of the P-well 50, even when the P-well 50 including the channel region 12 and the element region 52 is fixed at a ground potential $V_{GND}$. In other words, because the threshold voltage $V_{th}$ of the output transistor $T_{d1}$ is proportional to the square root of the effective P-type dopant density $N_a$ of the surface region of the P-well 50 in the gate region of the output transistor $T_{d1}$ and the square root of the potential $V_{BS}$ of the source wire 32, reduction of the effective dopant density $N_a$ enables suppression of variation of a threshold voltage $V_{th}$ due to a varying potential $V_{BS}$.

In this manner, the backgate effect can be suppressed without fixing the P-well of the element region 52 and the source region $S_{d1}$ of the output transistor $T_{d1}$ at identical potentials by connecting them.

Further, because shorting between the P-well 50 and the element region 52 becomes unlikely to be caused, smaller separation between the P-well 50 and the element region 52 is allowed. This enables a shorter source wire 22 and thus reduced wire capacitance thereof.

Consequently, it is possible to maintain high gain of the output section 10 while reducing the size of a solid state image capturing element.

What is claimed is:

1. A charge transfer element, comprising:
    a reverse conductive type semiconductor region formed in one major surface of one conductive type semiconductor substrate;
    a channel region of the one conductive type formed in the semiconductor region so as to extend in one direction;
    a plurality of transfer electrodes formed on the semiconductor substrate so as to intersect the channel region;
    a capacitance formed continuous from the channel region in the semiconductor region; and
    an output transistor having a source and a drain both formed in the semiconductor region, and a gate connected to the capacitance,
    wherein
    the semiconductor region where the output transistor is formed exhibits an dopant density profile in a depth direction of the semiconductor substrate, which has a maximum dopant density value relative to a middle region of the semiconductor region.

2. The charge transfer element according to claim 1, wherein dopant density of the semiconductor region where the output transistor is formed is lower in a surface region rather than in the middle region along the depth direction of the semiconductor substrate.

3. The charge transfer element according to claim 1, further comprising:
    a load transistor serially connected to the output transistor, and
    wherein
    the load transistor is formed in the semiconductor region where the output transistor is formed.

4. The charge transfer element according to claim 2, further comprising:
    a load transistor serially connected to the output transistor, and
    wherein
    the load transistor is formed in the semiconductor region where the output transistor is formed.

* * * * *